United States Patent [19]

Arldt et al.

[11] Patent Number: 5,615,827
[45] Date of Patent: Apr. 1, 1997

[54] FLUX COMPOSITION AND CORRESPONDING SOLDERING METHOD

[75] Inventors: Roy L. Arldt, Georgetown; Susan H. Downey; Harry J. Golden, both of Austin, all of Tex.; Issa S. Mahmoud, Apalachin, N.Y.; Clement A. Okoro, Round Rock, Tex.; James Spalik, Kirkwood, N.Y.

[73] Assignee: International Business Machines Corporation, Armonk, N.Y.

[21] Appl. No.: 251,806

[22] Filed: May 31, 1994

Related U.S. Application Data

[62] Division of Ser. No. 435,896, May 5, 1995, Pat. No. 5,531,838.

[51] Int. Cl.⁶ .................. B05D 5/12; B23K 1/20
[52] U.S. Cl. .......... 228/223; 427/96; 228/180.21; 29/840; 106/311; 361/743; 361/767; 361/808; 148/25
[58] Field of Search .............. 427/96, 97, 58; 361/736, 743, 767, 808; 106/311; 252/364; 148/23, 24, 320; 228/180.21, 180.22, 223; 29/840

[56] References Cited

U.S. PATENT DOCUMENTS

| | | | |
|---|---|---|---|
| 2,898,255 | 8/1959 | Thompson et al. | 148/23 |
| 3,424,625 | 1/1969 | Tiegel . | |
| 4,216,035 | 8/1980 | Bakos et al. | 148/23 |
| 4,419,146 | 12/1983 | Roberts | 148/23 |
| 4,896,817 | 1/1990 | Snyder et al. | 228/123 |
| 4,940,498 | 7/1990 | Rubin | 148/23 |
| 4,988,395 | 1/1991 | Taguchi et al. | 148/24 |
| 5,004,509 | 4/1991 | Bristol | 148/23 |
| 5,064,481 | 11/1991 | Davis et al. | 148/23 |
| 5,122,201 | 6/1992 | Frazier et al. | 148/23 |
| 5,215,601 | 6/1993 | Gomi et al. | 148/24 |
| 5,281,281 | 1/1994 | Stefanowski | 148/23 |
| 5,334,260 | 8/1994 | Stefanowski | 148/23 |
| 5,443,660 | 8/1995 | Gao et al. | 148/24 |

*Primary Examiner*—Shrive Beck
*Assistant Examiner*—Brian K. Talbot
*Attorney, Agent, or Firm*—Calfee, Halter & Griswold

[57] ABSTRACT

A new flux composition, as well as corresponding methods for soldering electronic components to printed circuit boards, is disclosed. The new flux composition includes pimelic acid and two organic solvents. Significantly, the new flux composition leaves essentially no ionic residues at the completion of the soldering processes used to mount electronic components onto printed circuit boards.

10 Claims, 1 Drawing Sheet

FLUX COMPOSITION AND CORRESPONDING SOLDERING METHOD

This is a divisional of application Ser. No. 08/435,896, filed May 5, 1995, now U.S. Pat. No. 5,531,838.

BACKGROUND OF THE INVENTION

1. Field of the Invention

The invention pertains to a flux composition and to a corresponding method for soldering, for example, a semiconductor chip or a chip carrier module to a printed circuit board.

2. Description of the Related Art

Fluxes play an important role in the procedures used to mount electronic components onto printed circuit cards and printed circuit boards (both of which are hereinafter generically referred to as printed circuit boards or PCBs). For example, one method for directly mounting a semiconductor integrated circuit device (hereinafter denominated a semiconductor chip or just a chip) onto a PCB is, for example, to form regions of solder, e.g., solder balls, on contact pads on the circuit-bearing surface of the chip. Such solder regions may also be formed on corresponding contact pads on the PCB. Then, a flux is applied to the solder regions on the chip and/or to the corresponding contact pads and/or corresponding solder regions on the PCB in order to remove oxide layers which may have formed on these solder regions or contact pads and to achieve increased wetting of the contact pads by the solder regions. Thereafter, with the circuit-bearing surface of the chip facing the PCB, the solder regions on the chip are brought into contact with the corresponding contact pads or solder regions on the PCB, and the resulting assembly is heated in order to melt, and thereby reflow, the solder regions on the chip and/or on the PCB. Upon cooling and re-solidification, the resulting solder connections between the chip and the PCB are typically encapsulated in an encapsulant, e.g., an epoxy resin encapsulant, to relieve any strains which may be engendered by a difference between the coefficient of thermal expansion (CTE) of the PCB and the CTE of the chip.

In a manner similar to that described above, one method for mounting a module, e.g., an organic module or a ceramic module, bearing semiconductor chips (hereinafter denominated a chip carrier module or just module) onto a PCB, involves forming, e.g., screening, regions of solder onto contact pads on the non-chip-bearing surface of the module. Such solder regions may also be formed on corresponding contact pads on the PCB. A flux is then applied to the solder regions on the module and/or to the corresponding contact pads and/or corresponding solder regions on the PCB. Thereafter, with the non-chip-bearing surface of the module facing the PCB, the solder regions on the module are brought into contact with the corresponding contact pads or solder regions on the PCB and the resulting assembly is heated in order to melt, and thereby reflow, the solder regions on the chip and/or on the PCB. In general, the magnitude of the difference between the CTE of the module and the CTE of the PCB is relatively small, and therefore the resulting solder connections between the module and the PCB need not be encapsulated in an encapsulant.

If the module of interest has electrically conductive pins extending from the non-chip-bearing surface of the module, then the module is mounted onto a PCB by, for example, initially positioning the module over the top (i.e., the circuit-bearing) surface of the printed circuit board and inserting the electrically conductive pins of the module into corresponding, copper plated through holes (PTHs) extending through the thickness of the PCB. Then, the PCB and the module are placed on a conveyor, which passes the PCB and module over a fluxing wave or flux sprayer, which serves to impinge liquid flux onto the bottom surface of the PCB and into the PTHs. This flux is wicked up into the PTHs, and thus flux is applied to both the walls of the PTHs and to the pins extending into the PTHs. Thereafter, the conveyor passes the PCB and module over a solder wave, which serves to impinge liquid solder onto the bottom surface of the of the PCB and into the PTHs. This liquid solder is also wicked up into the PTHs, filling the PTHs and, upon cooling and solidification, serving to encapsulate the pins within the PTHs.

One of the most important aspects of the above-described chip-mounting and module-mounting procedures is the choice of flux. That is, as noted above, the flux serves to remove any oxide layers which may have formed on the solder regions, contact pads, pins or PTHs and to increase the wetting of, for example, contact pads by solder regions. In most instances, at the completion of the soldering process, use of the commonly available fluxes results in ionic residues remaining on the solder regions, contact pads, pins or PTHs. Such ionic residues are undesirable because they lead to corrosion of circuitry and to short circuits. Consequently, if formed, such ionic residues must be removed, e.g., cleaned with water, after the completion of the soldering process.

The solder connections formed between a chip and a PCB or between a pinless module and a PCB, as described above, have relatively small heights, e.g., 4 mils, and therefore the spacing between a chip or pinless module and its PCB is correspondingly small. This is significant because it implies that it would be very difficult, if not impossible, to clean away any ionic residues remaining on the solder regions and/or contact pads after the completion of the soldering process. In addition, in the case of a pinned module, while corresponding ionic residues are readily cleaned with water, one must then deal with the environmental hazards posed by the resulting contaminated water.

Significantly, those engaged in the development of fluxes and soldering processes for mounting chips and modules onto PCBs have sought, thus far with little success, fluxes which leave essentially no ionic residues on solder regions, contact pads, pins or PTHs at the completion of the corresponding soldering processes.

SUMMARY OF THE INVENTION

The invention involves a new flux composition which leaves essentially no ionic residues at the completion of conventional soldering processes used to mount electronic components, such as chips and chip carrier modules, onto PCBs. Significantly, this composition includes pimelic acid ($HOOC(CH_2)_5COOH$) as the primary active ingredient, i.e., as the primary fluxing agent. In addition, this composition includes two organic solvents. The first organic solvent has a relatively low evaporation temperature, e.g., 82.4 degrees C., and is preferably isopropanol (isopropyl alcohol). The second organic solvent has a relatively high evaporation temperature, e.g., about 170 degrees C., and is preferably propylene glycol monobutyl ether (also denominated N-butylpropylglycol ether). While not essential, the composition preferably also includes a relatively small amount of water, preferably de-ionized water.

The invention also involves the application of the new flux composition to soldering processes used to mount electronic components, such as chips, chip carrier modules, resistors, capacitors, etc., onto PCBs.

BRIEF DESCRIPTION OF THE DRAWINGS

The invention is described with reference to the sole, accompanying FIGURE, not drawn to scale, denominated FIGS. 1(a), 1(b) and 1(c) for convenience, which depicts the steps involved in mounting a semiconductor chip, in the so-called flip-chip configuration, onto a PCB, in accordance with the invention.

DETAILED DESCRIPTION OF THE PREFERRED EMBODIMENT(S)

Figure 1A:
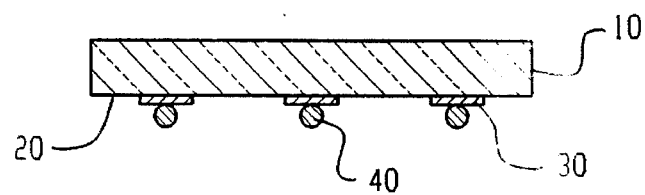

The invention involves a new flux composition which leaves essentially no ionic residues at the completion of conventional soldering processes used to mount electronic components onto PCBs. Consequently, there is no need to clean away such ionic residues at the completion of these soldering processes with, for example, water, and therefore there is no need to deal with the environmental hazards posed by water contaminated with ionic residues.

The invention also involves the application of the new flux composition to soldering processes used to mount electronic components, such as chips, chip carrier modules, resistors, capacitors, etc. onto PCBs.

Significantly, the new flux composition includes pimelic acid ($HOOC(CH_2)_5COOH$) as the primary active ingredient, i.e., as the primary fluxing agent. (It should be noted that at room temperature, pimelic acid is a solid, and that pimelic acid has a melting temperature of about 105 degrees C.) In addition, this new flux composition includes two organic solvents, the first of which has a relatively low evaporation temperature, e.g., 82.4 degrees C., and the second of which has a relatively high evaporation temperature, e.g., about 170 degrees C. While not essential, the new flux composition preferably also includes a relatively small amount of water, preferably de-ionized water. It should be noted that the pimelic acid, the second organic solvent and the water are soluble in the first organic solvent.

The first organic solvent is preferably isopropanol (isopropyl alcohol), which has an evaporation temperature of 82.4 degrees C. Useful alternatives to isopropanol include n-propanol and benzyl alcohol. As noted above, the pimelic acid, the second organic solvent, described below, and the water, if present, are soluble in the first organic solvent.

The second organic solvent is preferably propylene glycol monobutyl ether (also denominated N-butylpropylglycol ether), which has an evaporation temperature of about 170 degrees C. Useful alternatives to propylene glycol monobutyl ether include propylene glycol monopropyl ether and diethylene glycol monomethyl ether. It should be noted that upon evaporation of the first organic solvent during the soldering processes described below, the pimelic acid (and the water, if present) is then substantially dissolved in the second organic solvent, until the second organic solvent evaporates during the soldering processes.

The relative amount of pimelic acid in the inventive flux composition ranges from about 1% to about 6% by weight. If the inventive flux composition is to be used, for example, in soldering a semiconductor chip to a PCB, then the relative amount of pimelic acid is preferably 4.5% by weight. Relative amounts of pimelic acid less than about 1% by weight are undesirable because they result in insufficient and/or inadequate fluxing action, i.e., insufficient and/or inadequate removal of oxide layers and insufficient reductions in solder surface tensions. Relative amounts of pimelic acid greater than about 6% by weight are undesirable because they result in undesirably large amounts of residues at the completion of conventional soldering processes.

The relative amount of the first organic solvent, e.g., isopropanol, in the inventive flux composition ranges from about 25% to about 75% by weight. If the inventive flux composition is to be used, for example, in soldering a semiconductor chip to a PCB, then the relative amount of the first organic solvent is preferably 70.9% by weight. Relative amounts of the first organic solvent less than about 25% by weight are undesirable because the corresponding flux compositions may not be single phase systems and therefore the application of these compositions may result in undesirable, non-uniform distributions of pimelic acid. Relative amounts of the first organic solvent greater than about 75% by weight are undesirable because the corresponding concentrations of pimelic acid are undesirably low and therefore the corresponding fluxing actions are inadequate.

The relative amount of the second organic solvent, e.g., propylene glycol monobutyl ether, in the inventive flux composition ranges from about 10% to about 35% by weight. If the inventive flux composition is to be used, for example, in soldering a semiconductor chip to a PCB, then the relative amount of the second organic solvent is preferably 23.6% by weight. Relative amounts of the second organic solvent less than about 10% by weight are undesirable because the pimelic acid tends to precipitate out of solution, resulting in undesirable, non-uniform distributions of pimelic acid. Relative amounts of the second organic solvent greater than about 35% by weight are undesirable because the corresponding concentrations of pimelic acid are undesirably low and the corresponding fluxing actions are inadequate.

The relative amount of water, if used, in the inventive flux composition ranges from 0% to about 2% by weight. The purpose of the water, if present, is to provide positively charged ions to accelerate the initiation of fluxing action by the pimelic acid. If the inventive flux composition is to be used, for example, in soldering a semiconductor chip to a PCB, then the relative amount of water is preferably 0.9% by weight. Relative amounts of water greater than about 2% by weight are undesirable because this significantly increases the possibility that the application of the inventive flux composition will result in ionic residues.

By way of example, one embodiment of the inventive flux composition which is useful in soldering a semiconductor chip to a PCB is readily formed by dissolving 4.8 grams of pimelic acid, 25.0 grams of propylene glycol monobutyl ether and 1.0 grams of de-ionized water in 75.0 grams of isopropanol.

As noted above, the invention involves not only the new flux composition, per se, but also the application of the new flux composition to the soldering processes used to mount electronic components onto PCBs. Thus, for example, in mounting a semiconductor chip 10 (see FIG. 1(a)), in the so-called flip-chip configuration, onto a PCB 50 (see FIG. 1(b)), contact pads 30 on the circuitry-bearing surface 20 of the chip 10 are provided with solder regions, e.g., solder balls, 40. These solder regions 40 have compositions which include, for example, 90 atomic percent lead (Pb) and 10 atomic percent tin (Sn). Significantly, such solder regions have melting temperatures of 281 degrees C., and do not melt during the soldering process described below.

Figure 1B:
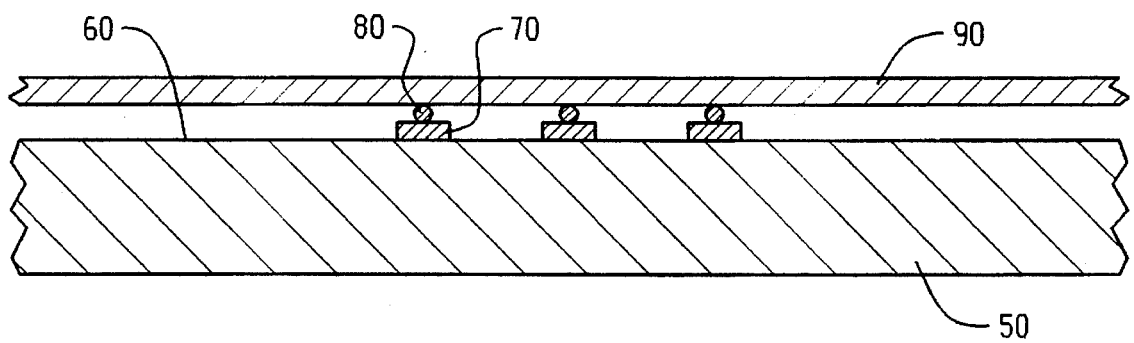

As shown in FIG. 1(b), prior to soldering the chip 10 to the PCB 50, contact pads 70 on the circuitry-bearing surface 60 of the PCB 50 are provided with relatively small solder regions, e.g., relatively small solder balls, 80. These relatively small solder regions 80 are readily transported to, and deposited on, the contact pads 70 via a decal 90. By contrast with the solder regions 40 used with the chip 10, the solder regions 80 have compositions which include, for example, 37 atomic percent Pb and 63 atomic percent Sn. These solder regions 80 have melting temperatures of 183 degrees C. and do melt during the soldering process, described below.

Prior to soldering the chip 10 to the PCB 50, the inventive flux composition is applied to the solder regions 80, and/or the solder regions 40, and/or the contact pads 70 on the PCB 50, and/or the contact pads 30 on the chip 10. This is readily accomplished using, for example, a syringe or a brush.

Figure 1C:
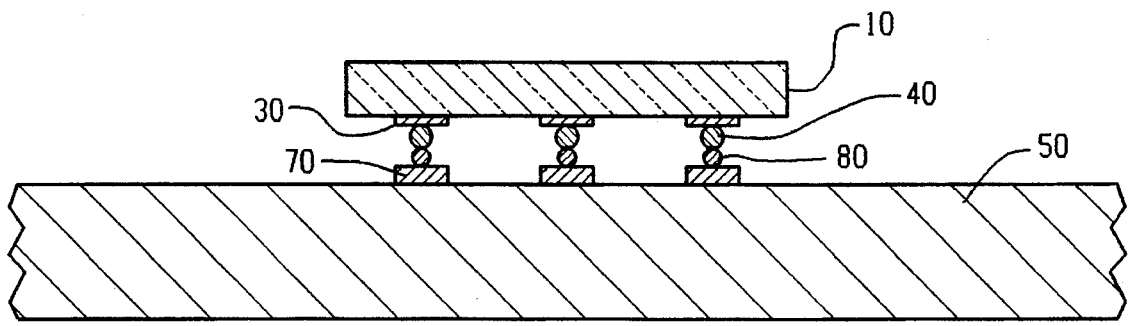

Having applied the inventive flux composition to the relevant solder regions and/or contact pads, and as depicted in FIG. 1(c), the chip 10 is positioned relative to the PCB 50 so that the solder regions 40 contact the solder regions 80. Consequently, these combined solder regions substantially extend from the chip contact pads 30 to the PCB contact pads 70.

With the solder regions 40 and 80 touching each other, the chip 10/PCB 50 assembly is heated in, for example, an oven. During this heating procedure, the oven temperature is initially raised to about 183 degrees C., and subsequently raised to about 250 degrees C. Then, the oven temperature is lowered to about 183 degrees C., and thereafter lowered to room temperature. As a consequence, the solder regions 80 undergo melting and flow around the solder regions 40, resulting in continuous metallurgical and electrical connections between the PCB 50 and the chip 10. While the cleaning of these continuous connections would be extremely difficult, and perhaps even impossible, no such cleaning is needed because essentially no ionic residues remain at the completion of this soldering process.

At the completion of the above-described soldering process, the continuous solder connections between the PCB 50 and the chip 10 are preferably encapsulated in, for example, an epoxy resin, using conventional techniques.

If the electronic component to be mounted onto a PCB is, for example, a (pinless) chip carrier module bearing at least one semiconductor chip, then such a module is readily mounted by, for example, screening solder regions onto contact pads on the non-chip-bearing surface of the module. Such solder regions may also be screened onto corresponding contact pads on the PCB. The inventive flux composition is then applied to the solder regions and/or the module contact pads and/or the PCB contact pads using, for example, a syringe or a brush. Thereafter, the module is positioned in relation to the PCB so that the solder regions on the module contact pads touch the solder regions on the PCB contact pads. Thus, these combined solder regions substantially extend from the module contact pads to the PCB contact pads. Then, with the module solder regions touching the PCB solder regions, the module/PCB assembly is heated in, for example, an oven in order to melt the module solder regions and/or the PCB solder regions.

By contrast with the above, if the electronic component to be mounted onto a PCB is, for example, a pinned chip carrier module bearing at least one semiconductor chip, then such a module is readily mounted by initially applying the inventive flux composition to the module pins and/or to the walls of corresponding PTHs in the PCB. This is readily accomplished (using any of a variety of conventional techniques) before the module pins are inserted into the PTHs, while the module pins are being inserted into the PTHs, or after the module pins are inserted into the PTHs. Preferably, this is accomplished after the module pins have been inserted into the PTHs by, for example, placing the module/PCB assembly on a conveyor, which passes this assembly over a fluxing wave or a flux sprayer. This fluxing wave or flux sprayer serves to impinge the inventive flux composition onto the bottom surface of the PCB and into the PTHs. The impinged flux is wicked up into the PTHs, and thus the inventive flux composition is applied to both the walls of the PTHs and to the module pins. Thereafter, the conveyor preferably serves to pass the module/PCB assembly over a solder wave, which serves to impinge liquid solder onto the bottom surface of the PCB and into the PTHs. This liquid solder is also wicked up into the PTHs, filling the PTHs and, upon cooling and solidification, serving to encapsulate the pins within the PTHs.

If the electronic component to be mounted onto a PCB is, for example, a discrete, passive electronic component, such as an electrical resistor or capacitor, having leads instead of pins, then such an electronic component is readily mounted using a procedure which is almost the same as that used with a pinned chip carrier module. The only difference is that the leads of the discrete, passive electronic component are not positioned inside the PTHs. Rather, these leads are positioned adjacent the PTHs, e.g., these leads are placed in contact with the lands encircling the PTHs. Thus, when the component/PCB assembly is passed over the fluxing wave or flux sprayer, the inventive flux composition is wicked up into the PTHs, onto the lands and onto the bottom portions of the leads. Similarly, when the component/PCB assembly is passed over the solder wave, liquid solder is wicked up into the PTHs, onto the lands encircling the PTHs and onto the bottom portions of the leads.

While the invention has been particularly shown and described with reference to preferred embodiments thereof, it will be understood by those skilled in the art that various changes in form and details may be made therein without departing from the spirit and scope of the invention.

We claim:

1. A method for mounting an electronic component onto a printed circuit board, which electronic component includes a surface bearing component contact pads and which printed circuit board includes a surface bearing board contact pads corresponding to said component contact pads, said component contact pads and/or said board contact pads bearing regions of solder, comprising the steps of:

applying a flux composition to said solder regions and/or said component contact pads and/or said board center pads, said flux composition including pimelic acid and first and second organic solvents, said second organic solvent having a higher evaporation temperature than said first organic solvent, and said pimelic acid and said second organic solvent being soluble in said first organic solvent, said flux composition further containing water in an amount of up to 2% by weight, said second solvent being capable of substantially dissolving the water in said composition upon evaporation of said first organic solvent;

positioning said electronic component in relation to said printed circuit board so that said regions of solder substantially extend from said component contact pads to said board contact pads; and applying heat, so that at least portions of at least some of said solder regions melt and flow.

2. A method for mounting an electronic component onto a printed circuit board, which electronic component includes a surface bearing component contact pads and which printed circuit board includes a surface bearing board contact pads corresponding to said component contact pads, said component contact pads and/or said board contact pads bearing regions of solder, comprising the steps of:

applying a flux composition to said solder regions and/or said component contact pads and/or said board contact pads, said flux composition comprising:
(a) 1 to 6% by weight pimelic acid,
(b) 25 to 75% by weight of a first organic solvent,
(c) 10 to 35% by weight of a second organic solvent having a higher evaporation temperature than said first organic solvent, said second organic solvent being soluble in said first organic solvent and also substantially dissolving the pimelic acid in said composition upon evaporation of said first organic solvent therefrom, and
(d) water in an amount of up to 2% by weight, said second solvent being capable of substantially dissolving the water in said composition upon evaporation of said first organic solvent;

positioning said electronic component in relation to said printed circuit board so that said regions of solder substantially extend from said component contact pads to said board contact pads; and applying heat, so that at least portions of at least some of said solder regions melt and flow.

3. The method of claim 2, wherein said second solvent is selected from the group consisting of propylene glycol monobutyl ether, propylene glycol monopropyl ether and diethylene glycol monomethyl ether.

4. The method of claim 3, wherein said first organic solvent is selected from the group consisting of isopropanol, n-propanol and benzyl alcohol.

5. A method for mounting an electronic component onto a printed circuit board, which electronic component includes electrically conductive members extending from said component and which printed circuit board includes plated through holes extending from a first surface to a second surface of said printed circuit board, comprising the steps of:

applying a flux composition to said electrically conductive members and/or said plated through holes, said flux composition including pimelic acid and first and second organic solvents, said second organic solvent having a higher evaporation temperature than said first organic solvent, and said pimelic acid and said second organic solvent being soluble in said first organic solvent, said pimelic acid also being substantially soluble in said second organic solvent, said composition further containing water in an amount of up to 2% by weight, said second solvent being capable of substantially dissolving the water in said composition upon evaporation of said first organic solvent;

prior to, during or after said applying step, positioning said electronic component adjacent to said first surface of said printed circuit board so that said electrically conductive members extend into, or are positioned adjacent to, said plated through holes; and impinging liquid solder onto said second surface of said printed circuit board and into said plated through holes, whereby said liquid solder flows through said plated through holes from said second surface toward said first surface to contact said electrically conductive members.

6. A method for mounting an electronic component onto a printed circuit board, which electronic component includes electrically conductive members extending from said component and which printed circuit board includes plated through holes extending from a first surface to a second surface of said printed circuit board, comprising the steps of:

applying a flux composition to said electrically conductive members and/or said plated through holes, said flux composition comprising:
(a) 1 to 6% by weight pimelic acid,
(b) 25 to 75% by weight of a first organic solvent,
(c) 10 to 35% by weight of a second organic solvent having a higher evaporation temperature than said first organic solvent, said second organic solvent being soluble in said first organic solvent and also substantially dissolving the pimelic acid in said composition upon evaporation of said first organic solvent therefrom, and
(d) water in an amount of up to 2% by weight, said second solvent being capable of substantially dissolving the water in said composition upon evaporation of said first organic solvent;

prior to, during or after said applying step, positioning said electronic component adjacent to said first surface of said printed circuit board so that said electrically conductive members extend into, or are positioned adjacent to, said plated through holes; and impinging liquid solder onto said second surface of said printed circuit board and into said plated through holes, whereby said liquid solder flows through said plated through holes from said second surface toward said first surface to contact said electrically conductive members.

7. The method of claim 6, wherein said second solvent is selected from the group consisting of propylene glycol monobutyl ether, propylene glycol monopropyl ether and diethylene glycol monomethyl ether.

8. The method of claim 7, wherein said first organic solvent is selected from the group consisting of isopropanol, n-propanol and benzyl alcohol.

9. The method of claim 8, wherein said second solvent is selected from the group consisting of propylene glycol monobutyl ether, propylene glycol monopropyl ether and diethylene glycol monomethyl ether.

10. The method of claim 9, wherein said first organic solvent is selected from the group consisting of isopropanol, n-propanol and benzyl alcohol.

* * * * *